United States Patent [19]

Hori

[11] Patent Number: 4,727,268

[45] Date of Patent: Feb. 23, 1988

[54] LOGIC CIRCUITRY HAVING TWO PROGRAMMABLE INTERCONNECTION ARRAYS

[75] Inventor: Chikahiro Hori, Yokohama, Japan

[73] Assignee: Kabushiki Kaisha Toshiba, Kawasaki, Japan

[21] Appl. No.: 832,347

[22] Filed: Feb. 24, 1986

[30] Foreign Application Priority Data

Feb. 28, 1985 [JP] Japan .................................. 60-39250

[51] Int. Cl.$^4$ .......................................... H03K 17/693
[52] U.S. Cl. .................................... 307/465; 307/240; 307/303; 307/468; 340/825.85; 357/45
[58] Field of Search .......... 357/45; 307/465, 468–469, 307/240–243, 303; 340/825.83, 825.85–825.87, 825.9–825.91; 364/716

[56] References Cited

U.S. PATENT DOCUMENTS

| | | | |
|---|---|---|---|
| 4,041,459 | 8/1977 | Horninger | 307/468 X |
| 4,404,663 | 9/1983 | Saeki et al. | 365/206 |
| 4,631,686 | 12/1986 | Ikawa et al. | 340/825.87 X |
| 4,642,487 | 2/1987 | Carter | 307/465 |
| 4,670,749 | 6/1987 | Freeman | 307/465 X |
| 4,673,966 | 6/1987 | Shimoyawa | 357/45 X |

OTHER PUBLICATIONS

Gamblin et al., "Thin-Film Universal Logic Block", *IBM T. D.B.*, vol. 9, No. 6, Nov. 1966, pp. 662-664.

*Primary Examiner*—Stanley D. Miller
*Assistant Examiner*—D. R. Hudspeth
*Attorney, Agent, or Firm*—Oblon, Fisher, Spivak, McClelland & Maier

[57] ABSTRACT

According to this invention a plurality of kinds of circuit blocks is formed as a circuit block area on a chip substrate to have a desired logic function. An array of signal output wires and array of signal input wires are formed adjacent the circuit block area such that these arrays intersect each other. First switching elements are each formed at a corresponding intersection of the signal output wire and signal input wire. An LSI device having a desired logic function can be implemented by electrically and fixedly writing an ON or OFF state of the first switching element. A first control wire and second control wire are provided adjacent to the circuit block area with the wire arranged parallel to the signal output wire and the wire arranged parallel to the signal input wire. Second switching elements are arranged at intersections of the first control wire and the signal input wires and at intersections of the second control wire and signal output wires. To a given circuit block, the output signals of the other circuit blocks can be supplied in a time-division fashion by controlling the second switching element, in real time, by virtue of a control circuit.

2 Claims, 6 Drawing Figures

SWITCHING ELEMENT
CONTROL CIRCUIT

F I G. 2B
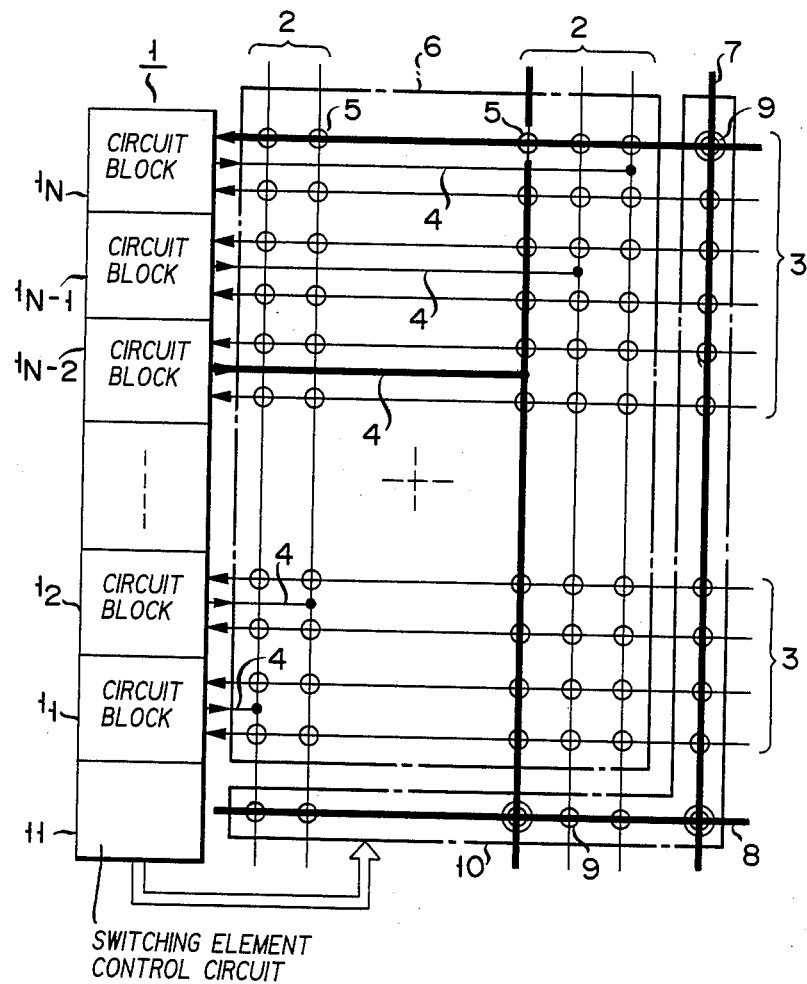
SWITCHING ELEMENT
CONTROL CIRCUIT

LOGIC CIRCUITRY HAVING TWO PROGRAMMABLE INTERCONNECTION ARRAYS

BACKGROUND OF THE INVENTION

This invention relates to a semiconductor integrated circuit device whose chip function is programmable.

Recent advances in semiconductor integrated circuitry permits of high integration density. In the field of logic LSI's there is a growing demand to develop small quantities of a large variety of logic LSI's for short periods of time and at lower costs because of constant and abrupt shifts in the type of logic LSI required. Various types of logic LSI's have been manufactured by the following known methods in an effort to comply with this demand.

THE STANDARD CELL SYSTEM

Many kinds of basic logic circuit patterns (standard cells) necessary for the implementation of various logic functions are entered into a computer. A desired logic LSI is produced by the automatic layout and routing of many standard cells through the utilization of the computer.

THE GATE ARRAY SYSTEM

An array of basic gates (basic cells) for constituting a logic circuit is formed on a substrate using a custom LSI method. Through utilization of a computer, a wiring pattern is determined on the basis of an automatic wiring layout and routing techniques to obtain the desired logic LSI.

These methods have the advantage of requiring a shorter development period than that of a completely handcrafted LSI. Even in these methods, however, a lithographic technique is required in the formation of a wiring pattern to obtain the desired logic function. Consequently, even these methods require several weeks or months from the completion of a design to the completion of an LSI.

SUMMARY OF THE INVENTION

An object of this invention is to provide a semiconductor integrated circuit device which permits easy realization of the desired logic function through a user's manipulation of its electrical wiring, and whose chip function is field-programmable.

Another object of this invention is to provide a semiconductor integrated circuit which, even if a desired wiring is used as a common bus, prevents an increase in the capacity of a load connected to the common bus.

The semiconductor integrated circuit device of this invention includes, on a substrate, a plurality of different kinds of circuit blocks having their own desired logic function, and at least one signal input terminal and one signal output terminal. The signal input wire and signal output wire connected to the respective circuit blocks are formed adjacent to a circuit block area, with the signal input wire electrically insulated from and intersecting but not coming into electrical contact with the signal output wire. At intersections of the signal input wires and signal output wires are formed first switching elements, each of which is connected between the corresponding signal input wire and signal output wire. The first switching element permits its ON or OFF state to be electrically and fixedly written. The input/output relation of the respective circuit block is determined by which of either the ON or OFF state of the switching element is written.

In the wiring area are arranged at least one first control wire in parallel with the signal output wire and at least one second control wire in parallel with the signal input wire. Second switching elements are arranged at intersections of the first control wire and the signal input wires and at intersections of the second control wire and the signal output wires. In this embodiment, one of the second switching elements is placed at intersection of the first control wire and the second control wire. The state of the connection between the first control wire and the signal input wire and that of the connection between the second control wire and the signal output wire is determined by the ON/OFF control operation of the second switching elements.

Outputs of circuit blocks are input to a given circuit block in a time-division fashion through the use of the first and second control wires and second switching elements. That is, a control circuit for controlling the second switching elements is formed in the chip substrate, and the second switching elements are ON/OFF real-time controlled by the control circuit during operation of the logic circuit.

BRIEF DESCRIPTION OF THE DRAWINGS

FIGS. 2A and 2B each illustrate the operation of the programmable LSI device;

DETAILED DESCRIPTION OF THE PREFERRED EMBODIMENTS

Figure 1:
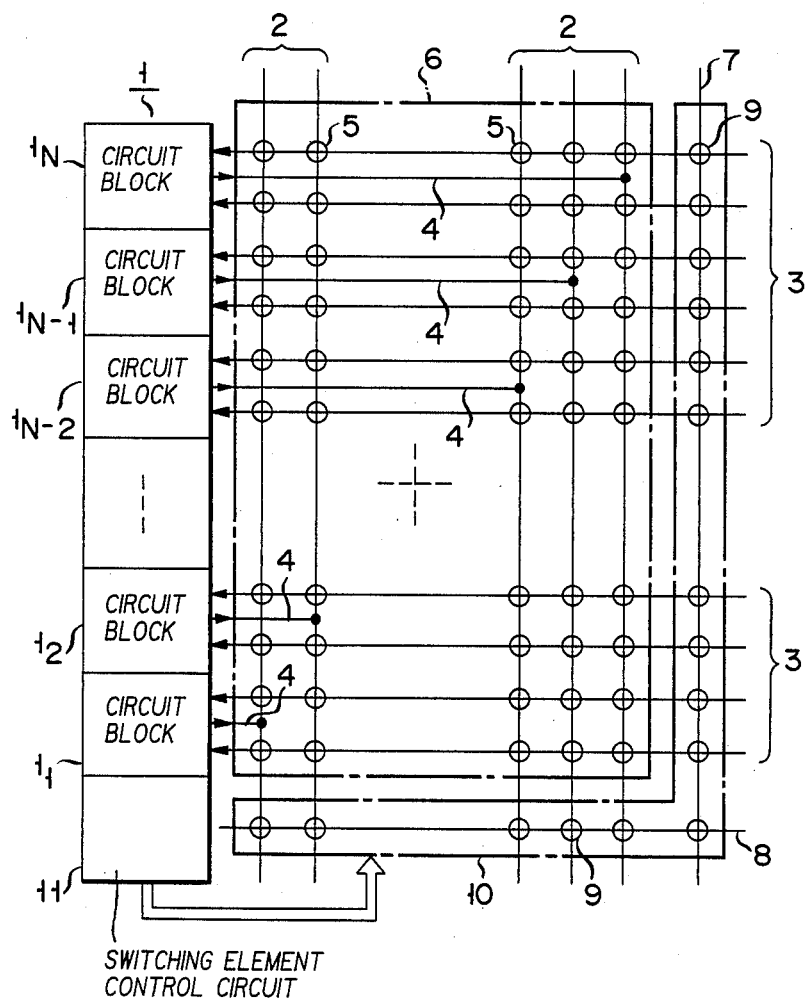
FIG. 1 is a view showing a programmable LSI device according to one embodiment of this invention.

FIG. 1 is a plan view of the programmable LSI device of this invention. An array of circuit blocks, $1_1$, $1_2$, ..., $1_N$, is provided on such an unillustrated chip substrate as a silicon wafer. Respective circuit blocks $1_1$, $1_2$, ..., $1_N$ each have a desired logic function and are each comprised of a logic function element such as a 4-input NAND gate or a combination of such elements. As well, respective circuits $1_1$, $1_2$, ..., $1_N$ each include at least one signal input terminal and at least one signal output terminal. The logic function element is a standard cell manufactured for practical application by means of the aforementioned standard cell system. Circuit block area 1 may be a wired gate array.

In this embodiment, circuit block area 1 is of a CMOS type and, as such, has the following MSI level circuit blocks:

(1) 15 blocks having two 4-input NAND gates
(2) 14 blocks having four 2-input NAND gates
(3) 1 block having an 8-input NAND gate
(4) 100 blocks having four inverters
(5) 19 blocks having an 8-bit register
(6) 19 blocks having two D type flip-flops
(7) 17 blocks having two 4-input AND gates
(8) 13 blocks having four 2:1 data selectors
(9) 11 blocks having two 4-bit binary counters
(10) 7 blocks having two 2-1 line decoders
(11) 3 blocks having a 3-8 line decoder

(12) 5 blocks having two 4-1 selectors
(13) 4 blocks having an 8-1 selector
(14) 3 blocks having an 8-bit serial input, parallel-output shift resister
(1) 3 blocks having an 8-bit serial input,
(15) 3 blocks having an 8-bit parallel-input, serial-output shift register
(16) 2 blocks having an 8-bit serial-input, serial-output shift register
(17) 4 blocks having two monostable multivibrators
(18) 4 blocks having four 2-input OR gates
(19) 3 blocks having four 2-input NOR gates
(20) 3 blocks having two AND-OR inverters
(21) 3 blocks having a 64-bit RAM
(22) 2 blocks having four 2-input EXCLUSIVE-OR gates
(23) 3 blocks having a 4-bit comparator
(24) 4 blocks having two J-K flip-flops
(25) 3 blocks having a 9-bit even/odd parity generator/-checker
(26) 2 blocks having a 4-bit binary full adder
(27) 5 blocks having four 2-input multiplexers
(28) 2 blocks having four S-R latches
(29) 1 block having an ALU
(30) 1 block having an 8-bit addressable latch
(31) 1 block having a look-ahead carry generator In this way, 274 MSI level circuit blocks are formed to permit all their functions to be implemented through an input/output relation of them. The number of the respective circuit blocks is, on the average, 8 for the input terminals and 4 for the output terminals. An output buffer is provided for an output section of the respective circuit block.

A wiring area is arranged adjacent to circuit block area 1. Signal output wires 2 are arranged parallel to an array of circuit blocks, $1_1, 1_2, \ldots, 1_N$. Signal input wires 3 are arranged in a direction intersecting the signal output wires 2, noting that signal output wires 2 and signal input wires 3 are formed as two different level layers with an insulating layer located between these two different level layers. Signal input wires 3 are connected to one corresponding input terminal of each of circuit blocks $1_1, 1_2, \ldots, 1_N$. Signal output wires 2 are connected to circuit blocks $1_1, 1_2, \ldots 1_N$ through respective branch wires 4 which are arranged parallel to signal input wires 3. Branch wires 4 are formed of a conductive layer of the same level as that of signal input wires 3 and connected through a corresponding through hole to signal output wires 2.

First switching elements 5 are disposed at the intersections of signal input wires 3 and signal output wires 2. One terminal of each of first switching elements 5 is connected to signal input wires 3 and the other terminal of each of elements 5 is connected to signal output wires 2. First switching elements 5 constitute an E²PROM or 1 bit memory-equipped MOS transistor which permits an ON or an OFF state to be electrically and fixedly written, for example, from outside of a chip. The input-/output relation of circuit blocks $1_1, 1_2, \ldots, 1_N$ is determined by setting the elements in first switching element array 6 to an ON or OFF state. The signal input terminal of one circuit block is connected to the signal output terminal of another circuit block through one switching element which has been turned ON. With the length of signal input wires 3 and signal output wires 2 each represented by l, the length of the wire held at an equipotential level with one switching element ON will, on average, be 2.5 l, in which case 0.5 l denotes the average length of branch wires 4.

The basic configuration of the programmable LSI device has already been disclosed in the specification of U.S. patent application Ser. No. 646,121, now U.S. Pat. No. 4,631,686 assigned to the same applicant as that of this application. This invention solves a problem encountered when a common bus structure is implemented using only the basic arrangement set forth in application Ser. No. 646,121.

In addition to the basic arrangement of the previous applications invention, this embodiment includes first control wire 7, parallel to signal output wires 2, and second control wire 8, parallel to signal input wires 3. First control wire 7 is formed of a conductive layer of the same level as that of signal output wires 2, and second control wire 8 is formed of a conductive layer of the same level as that of signal input wires 3. Second switching elements 9 are arranged one at one of the intersections of first control wire 7 and signal input wires 3 and the other at one of the intersections of second control wire 8 and signal output wires 2. Second switching element 9 is also arranged at the intersection of first control wire 7 and second control wire 8. Second switching element 9, unlike first switching element 5, requires no memory function. An ordinary MOS transistor can, for example, be used as second switching element 9. With one second switching element 9 on one intersection in an ON state, a connection is established between its corresponding first control wire 7 and signal input wire 3, or, as the case may be, between its corresponding second control wire 8 and signal output wire 2. Switching element control circuit 11 is arranged on one end of circuit block area 1 and real-time controls the ON/OFF state of second switching element 9 during operation of the logic circuit.

In the aforementioned arrangement, a desired logic function is implemented by programming first switching element array 6 with a connection format. According to this system, since the chip function is field-programmable, the user can himself electrically write his own desired logic function. By so doing, the user can quickly own a desired logic LSI with a high logic function. Since an LSI design is made through input and output connections of a plurality of circuit blocks having a certain logic function, it is easier for a logic designer who is skilled in implementing his own intended logic on a board.

A common bus operation is performed by controlling second switching element array 10 by means of switching element control circuit 11.

Supplying the outputs of circuit blocks $1_1$ and $1_{N-2}$, in a time-division fashion, to circuit block $1_N$ will be explained below in more detail.

Figure 2A:
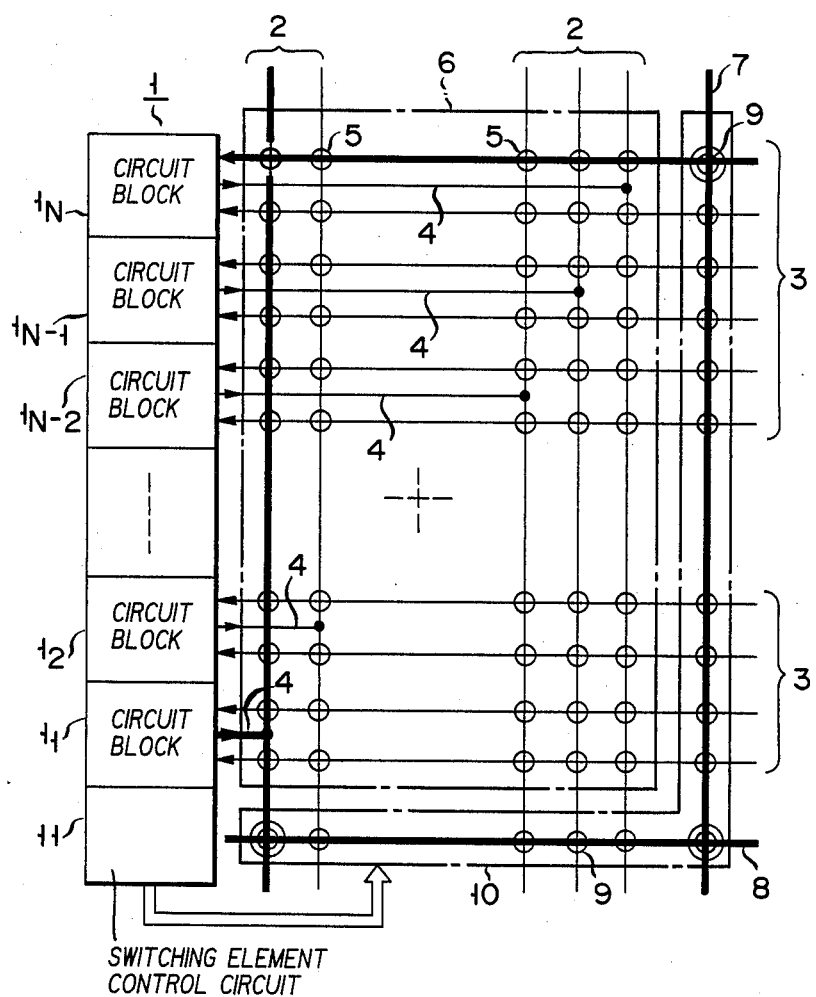

FIG. 2A shows a connection state of elements which is established in a timing $t_1$ in which an output of circuit block $1_1$ is input to circuit block $1_N$ and FIG. 2B shows a connection state of elements which is created in a timing $t_2$ in which an output of circuit block $1_{N-2}$ is input to circuit block $1_N$. In FIGS. 2A and 2B, double circles each show a switching element in an ON state. In the timing $t_1$, as shown in FIG. 2A, switching elements 9 are turned ON one at an intersection of first control wire 7 and second control wire 8, one at an intersection of first control wire 7 and signal input wire 3 connected to an input terminal of circuit block $1_N$, and one at an intersection of second control wire 8 and signal output wire 2 connected to an output terminal of circuit block $1_1$. At this time, the wires as indicated by a heavy line in FIG. 2A are set at an equipotential level. In the timing $t_2$, as shown in FIG. 2B, switching elements 9 are turned ON one at an intersection of first control wire 7 and second control wire 8, one at an intersection of first control wire 7 and signal input wire 3 connected to an input terminal of circuit block $1_N$ and one at an intersection of second control wire 8 and signal output wire 2 connected to an output terminal of circuit block $1_{N-2}$. At this time, the wires as indicated by a heavy line in FIG. 2B are set at an equipotential level.

As set out above, second switching element array 10 is controlled by switching element control circuit 11 in real time and the outputs of a plurality of block circuits can be input in a time-division fashion to the respective circuit block.

A common bus structure can be implemented, without using second switching element array 10, by programming the first switching element array 6. The embodiment of this invention is excellent in high-speed operation over a common bus structure which is achieved by the programming of the first switching element array 6. This will be explained below in more detail.

Figure 3:
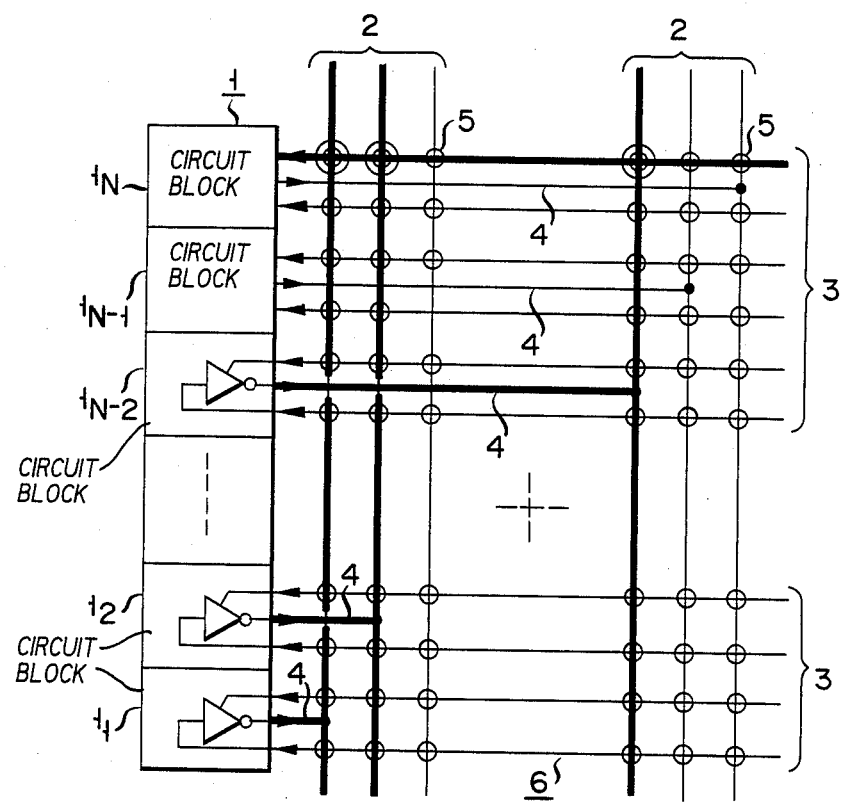
FIG. 3 is a view showing the programmable LSI device disclosed in a prior application submitted by the applicant of this application.

FIG. 3 shows a common bus structure which is implemented by the programming of first switching element array 6. In this embodiment, it is necessary that, with signal input wire 3 connected to circuit block $1_N$ for a common bus, the outputs of circuit blocks $1_1$, $1_2$ and $1_{N-2}$ be input to circuit block $1_N$ in a time-division fashion. First switching elements 5 are turned ON, as indicated by a double circle in FIG. 3, at the respective intersections of signal output wires 2, connected to the output terminals of circuit blocks $1_1$, $1_2$ and $1_{N-2}$ and signal input wires 3, connected to an input terminal of circuit block $1_1$. In this case, the wires as indicated by a heavy line in FIG. 3 are set at an equipotential level. As set out above, since first switching elements in array 6 is set fixedly at the ON/OFF state, tristate drivers as shown in FIG. 3 are required in the output sections of circuit blocks $1_1$, $1_2$ and $1_{N-2}$. The wires connected to a common bus are retained at an equipotential level and thus the output terminal of the circuit block which delivers no output signal needs to be maintained at a high impedance level.

Upon comparison between FIGS. 2A and 2B on one hand and FIG. 3 on the other hand, a total length of the wiring as indicated by the heavy line in these Figures is shorter in the former case than in the latter case. In comparison with the common bus structure implemented by the programming of first switching element array 6, the embodiment of this invention can realize the same function through a real time control of second switching element array 10, with the result that the capacity of a load connected to the common bus is smaller. As a result, the programmable LSI device of this embodiment assures a high-speed operation.

In the arrangement shown in FIG. 3, in order to compensate for a lowered operation speed resulting from the capacity of the wiring it is necessary to increase a driving power of a tristate driver in the circuit block. In order to increase the size of the tristate driver, however, the output terminal capacitance is increased by that extent, failing to enhance the performance of the device as desired. Whether or not a plurality of tristate drivers is connected to one common bus is a matter of logic design choice, not a matter of design predictability. The layout of a greater number of tristate drivers of enough great a size presents a bar to the implementation of a high integration density unit. For this reason, the device of this invention obviates the necessity of requiring tristate drivers and, even if such drivers are used in the fabrication of the LSI device, no greater size of tristate drivers is necessary according to this invention. Thus, a high-speed logic circuit can be obtained without preventing a high integration density.

Figure 4:
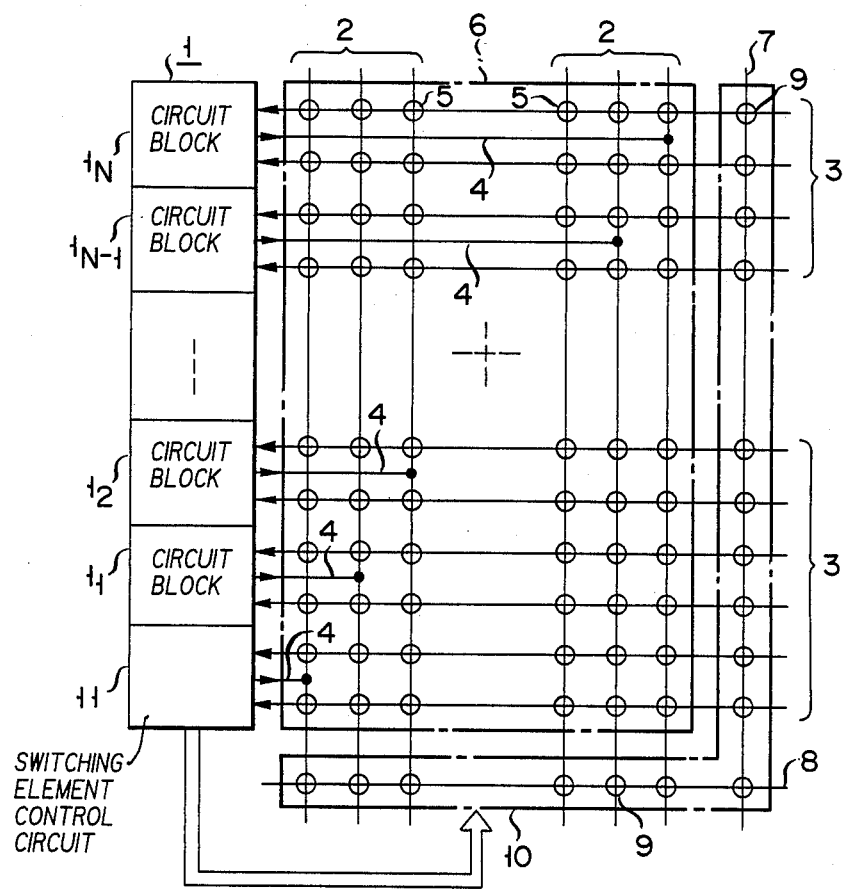
FIG. 4 is a view showing a programmable LSI device according to another embodiment of this invention.
Figure 5:
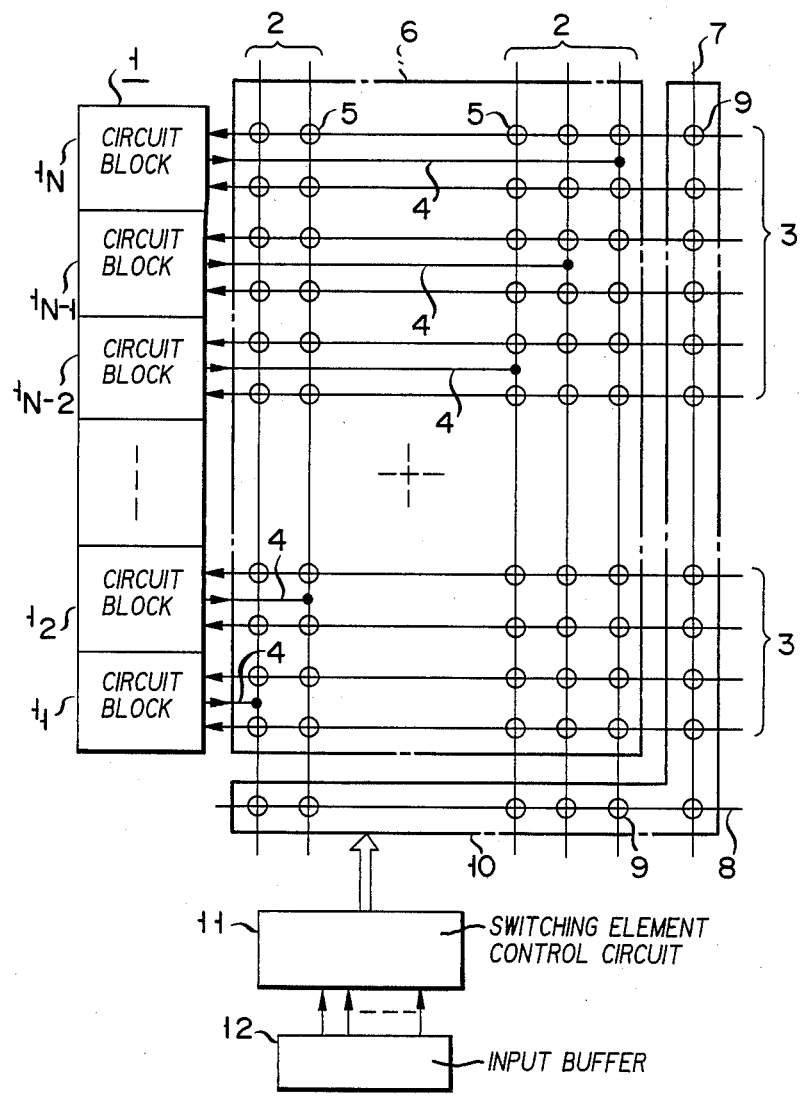
FIG. 5 is a view showing a programmable LSI device according to yet another embodiment of this invention.

FIGS. 4 and 5, each, show a programmable LSI according to another embodiment of this embodiment. In these Figures, the same reference numerals are used to designate parts or elements corresponding to those shown in FIG. 1. Therefore, no further detailed explanation is necessary.

In FIG. 1, use is made, as switching element control circuit 11, of a circuit which is dedicated for that purpose. In the embodiment of FIG. 4, switching element control circuit 11, like the other block circuits, permits its input/output relation to be programmed through first switching element array 6. In the embodiment of FIG. 5, switching element control circuit 11 is provided in an area separate from the other circuit blocks. A control signal from outside a chip is supplied through input buffer 12 to switching element control circuit 11.

From this it will be evident that the same effect as in the preceding embodiments can also be obtained according to the embodiments of FIGS. 4 and 5.

A combination of the arrangements of FIGS. 4 and 5 may also be used in which the switching element control circuit permits into input/output relation to be field-programmed as in the case of the other circuit blocks and to be controlled from outside a chip.

Although the switching element has been placed at the intersection of first and second control wires 7 and 8, it may be omitted. Since there is no inconvenience to the user even if first control wire 7 is normally connected to second control wire 8, both the wires may be connected together through a corresponding through hole.

What is claimed is:

1. A semiconductor integrated circuit device comprising:
    (a) a semiconductor substrate;
    (b) a plurality of kinds of circuit blocks each formed on said substrate and having its own logic function;
    (c) a plurality of signal input wires formed on said substrate in a direction parallel to each other and connected to respective ones of signal input terminals of said circuit blocks.
    (d) a plurality of signal output wires formed on said substrate, each arranged in a direction intersecting the signal input wire and electrically insulated from the signal input wire;
    (e) a plurality of branch lines each formed on said substrate branched from the signal output line, and connected to a signal output terminal of respective ones of said circuit blocks;
    (f) a first switching element array comprised of switching elements on said substrate, each of which is arranged at a respective intersection between the signal input wire and signal output wire and in which a connection state between the signal input wire and the signal output wire is determined by electrically writing an ON or OFF state;
    (g) a first control wire formed on the substrate in a direction parallel to the signal output line;

(h) a second control wire formed on the substrate in a direction parallel to the signal inputs wire;

(i) a second switching element array formed on said substrate and comprised of switching elements at respective intersections of said first control wire and said signal input wires and at respective intersections of said second control wire and said signal output wires, a state of connection between said first control wire and the signal input wire and that between said second control wire and the signal output wires being determined by an ON/OFF control; and (j) a switching element control circuit formed on said substrate and coupled for controlling the second switching element in real time.

2. A semiconductor integrated circuit device according to claim 1, in which said first control wire is formed of a conductive layer of the same level as that of said signal output wire and said second control wire is formed of a conductive layer of the same level as that of said signal input wire.

* * * * *